(12) United States Patent
Lin et al.

(10) Patent No.: US 10,403,382 B2
(45) Date of Patent: Sep. 3, 2019

(54) GATE DRIVING CIRCUIT AND DISPLAY APPARATUS

(71) Applicant: HannStar Display Corporation, Taipei (TW)

(72) Inventors: Sung-Chun Lin, Tainan (TW); Chien-Ting Chan, Tainan (TW); Yu-Tuan Hsu, Taichung (TW); Po-Yi Chen, Pingtung County (TW); Hsien-Tang Hu, Taichung (TW); Hsuan-Chen Liu, Kaohsiung (TW)

(73) Assignee: HannStar Display Corporation, Taipei (TW)

( * ) Notice: Subject to any disclaimer, the term of this patent is extended or adjusted under 35 U.S.C. 154(b) by 250 days.

(21) Appl. No.: 15/351,457

(22) Filed: Nov. 15, 2016

(65) Prior Publication Data
US 2018/0040272 A1    Feb. 8, 2018

(30) Foreign Application Priority Data

Aug. 5, 2016   (CN) .......................... 2016 1 0635289
Aug. 5, 2016   (CN) .......................... 2016 1 0635597

(51) Int. Cl.
G09G 3/20        (2006.01)
G11C 19/28       (2006.01)

(52) U.S. Cl.
CPC .............. *G11C 19/28* (2013.01); *G09G 3/20* (2013.01); *G09G 2310/0267* (2013.01); *G09G 2310/0286* (2013.01)

(58) Field of Classification Search
CPC .. G11C 19/28; G09G 3/20; G09G 2310/0267; G09G 2310/0286
See application file for complete search history.

(56) References Cited

U.S. PATENT DOCUMENTS

| | | | |
|---|---|---|---|
| 8,654,055 B2 | 2/2014 | Kim et al. | |
| 2010/0164915 A1* | 7/2010 | Kim | G09G 3/3677 345/205 |

(Continued)

FOREIGN PATENT DOCUMENTS

| CN | 101290803 A | 10/2008 |
|---|---|---|
| CN | 102819998 A | 12/2012 |

(Continued)

*Primary Examiner* — Abhishek Sarma
(74) *Attorney, Agent, or Firm* — CKC & Partners Co., LLC

(57) ABSTRACT

The invention provides a gate driving circuit and a display apparatus. The gate driving circuit includes $1^{st}$ to $N^{th}$ stage shift registers for respectively generating and sequentially outputting $1^{st}$ to $N^{th}$ stage scan signals to the display panel, where N is an integer greater than or equal to 4. Each of the shift registers is configured to receive a starting signal, and the starting signal is utilized to trigger the $1^{st}$ and $2^{nd}$ stage shift registers to generate the $1^{st}$ and $2^{nd}$ stage scan signals respectively, and the starting signal is utilized to reset the $3^{rd}$ to $N^{th}$ stage shift registers.

20 Claims, 10 Drawing Sheets

(56) References Cited

U.S. PATENT DOCUMENTS

2011/0157263 A1 6/2011 Kim et al.
2017/0193956 A1* 7/2017 Xiao ................. G02F 1/133514

FOREIGN PATENT DOCUMENTS

| | | |
|---|---|---|
| CN | 103594118 A | 2/2014 |
| CN | 103996367 A | 8/2014 |
| CN | 104050935 A | 9/2014 |
| CN | 104103244 A | 10/2014 |
| CN | 104217763 A | 12/2014 |
| CN | 104299583 A | 1/2015 |
| CN | 104575409 A | 4/2015 |
| CN | 104575411 A | 4/2015 |
| CN | 106328074 A | 1/2017 |
| KR | 20140043203 A | 4/2014 |
| KR | 20140095209 A | 8/2014 |
| KR | 20150014619 A | 2/2015 |
| KR | 20150047038 A | 5/2015 |

* cited by examiner

GATE DRIVING CIRCUIT AND DISPLAY APPARATUS

RELATED APPLICATIONS

This application claims priority to Chinese Patent Application Serial Number 201610635289.3, filed on Aug. 5, 2016, and Chinese Patent Application Serial Number 201610635597.6, filed on Aug. 5, 2016, which are herein incorporated by reference.

BACKGROUND

Field of the Invention

The invention relates to a gate driving circuit and a display apparatus, and more particularly to a gate driving circuit and a display apparatus which can improve image display quality.

Description of Related Art

A flat panel display device, such as a liquid crystal display (LCD) device or an organic light-emitting diode (OLED) display device, generally has a lot of shift registers for controlling gray levels of all pixels displayed in the display device at the same time point. On the other hand, for circuit designs of shift registers, the correctness of outputs corresponding to signals at each time point should be taken into account, in order to ensure image display quality of the display device. However, if waveforms of scan signals outputted by shift registers have errors, image data would be erroneously displayed by the display device. In addition, for a high-definition flat display device, shift registers would be easily interfered by noise, which results in image display issue.

SUMMARY

An objective of the invention is to provide a gate driving circuit and a display apparatus which can ensure completeness of waveforms of scan signals generated by a gate driver, so as to avoid writing erroneous data into corresponding pixels and being affected by noise that causes image display issues, thereby improving image display quality of the display apparatus and reliability of shift registers and reducing power consumption.

One aspect of the invention is directed to a gate driving circuit which is configured to drive a display panel. The gate driving circuit includes $1^{st}$ to $N^{th}$ stage shift registers for respectively generating and sequentially outputting $1^{st}$ to $N^{th}$ stage scan signals to the display panel, where N is an integer greater than or equal to 4. Each of the shift registers is configured to receive a starting signal, and the starting signal is utilized to trigger the $1^{st}$ and $2^{nd}$ stage shift registers to generate the $1^{st}$ and $2^{nd}$ stage scan signals respectively, and the starting signal is utilized to reset the $3^{rd}$ to $N^{th}$ stage shift registers.

In one or more embodiments of the invention, the $i^{th}$ stage scan signal is further configured to reset the $(i-j)^{th}$ stage shift register, where i is an integer from 4 to N, and j is an integer greater than 2 and smaller than i.

In one or more embodiments of the invention, j is 3 or 4.

In one or more embodiments of the invention, the $i^{th}$ stage shift register includes a precharge unit, a pull-up unit and a pull-down unit, where i is an integer from 1 to N. The precharge unit is configured to receive a first input signal and a second input signal and to output a precharge signal via a node based on the first input signal and the second input signal. The pull-up unit is coupled to the precharge unit. The pull-up unit is configured to receive the precharge signal and a clock signal, and to output the $i^{th}$ stage scan signal based on the precharge signal and the dock signal. The pull-down unit is coupled to the precharge unit and the pull-up unit. The pull-down unit is configured to receive the precharge signal and a pull-down control signal, and to control a level of the $i^{th}$ stage scan signal based on the precharge signal and the pull-down control signal.

In one or more embodiments of the invention, the precharge unit includes first and second transistors. A gate of the first transistor is configured to receive the first input signal, one of a source and a drain of the first transistor is configured to receive a first reference voltage, and the other of the source and the drain of the first transistor is coupled to the node. A gate of the second transistor is configured to receive the second input signal, one of a source and a drain of the second transistor is configured to receive a second reference voltage, and the other of the source and the drain of the second transistor is coupled to the node.

In one or more embodiments of the invention, when i is 1 or 2, the first input signal is the starting signal, and the second input signal is the $(i+j)^{th}$ stage scan signal; when i is from 3 to (N−j), the first input signal is the $(i-2)^{th}$ stage scan signal, and the second input signal is the $(i+j)^{th}$ stage scan signal; and when i is from (N−j+1) to N, the first input signal is the $(i-2)^{th}$ stage scan signal, and the second input signal is the starting signal or an ending signal, where j is an integer greater than 2 and smaller than (N−2).

In one or more embodiments of the invention, the pull-up unit includes a third transistor. A gate of the third transistor is coupled to the node, one of a source and a drain of the third transistor is configured to output the $i^{th}$ stage scan signal, and the other of the source and the drain of the third transistor is configured to receive the clock signal.

In one or more embodiments of the invention, the pull-down unit includes fourth to thirteenth transistors. One of a source and a drain of the fourth transistor is configured to receive a reference voltage, and the other of the source and the drain of the fourth transistor is configured to receive a third input signal. A gate of the fifth transistor is coupled to a gate of the fourth transistor, one of a source and a drain of the fifth transistor is configured to receive the reference voltage, and the other of the source and the drain of the fifth transistor is configured to receive a fourth input signal. A gate of the sixth transistor is coupled to the gate of the fourth transistor, one of a source and a drain of the sixth transistor is configured to receive the reference voltage, and the other of the source and the drain of the sixth transistor is configured to receive a fifth input signal. A gate of the seventh transistor is coupled to the gate of the fourth transistor, one of a source and a drain of the seventh transistor is configured to receive the reference voltage, and the other of the source and the drain of the seventh transistor is configured to receive a sixth input signal. One of a source and a drain of the eighth transistor is configured to receive the pull-down control signal, and the other of the source and the drain of the eighth transistor is coupled to the gate of the fourth transistor. A gate and one of a source and a drain of the ninth transistor are configured to receive the pull-down control signal, and the other of the source and the drain of the ninth transistor is coupled to a gate of the eighth transistor. A gate of the tenth transistor is configured to receive a seventh input signal, one of a source and a drain of the tenth transistor is configured to receive the reference voltage, and the other of the source and the drain of the tenth transistor is coupled to the gate of the fourth transistor. A gate of the eleventh transistor is configured to receive the third input signal, one of a source and a drain of the fourth transistor is configured to receive the reference voltage, and the other of the source and the drain of the eleventh transistor is coupled to the gate of the fourth transistor. A gate of the twelfth transistor is configured to receive the fifth input signal, one of a source and a drain of the twelfth transistor is configured to receive the reference voltage, and the other of the source and the drain of the fourth transistor is coupled to the gate of the eighth transistor. A gate of the thirteenth transistor is configured to receive the third input signal, one of a source and a drain of the thirteenth transistor is configured to receive the reference voltage, and the other of the source and the drain of the thirteenth transistor is coupled to the gate of the eighth transistor.

In one or more embodiments of the invention, when i is 1 or 2, the third input signal is the precharge signal at the node of the $1^{st}$ stage shift register, the fourth input signal is the $1^{st}$ stage scan signal, the fifth input signal is the precharge signal at the node of the $2^{nd}$ stage shift register, the sixth input signal the $2^{nd}$ stage scan signal, and the seventh input signal is the starting signal.

In one or more embodiments of the invention, when i is an odd number greater than or equal to 3 and smaller than or equal to N, the third input signal is the precharge signal at the node of the $i^{th}$ stage shift register, the fourth input signal is the $i^{th}$ stage scan signal, the fifth input signal is the precharge signal at the node of the $(i+1)^{th}$ stage shift register, the sixth input signal the $(i+1)^{th}$ stage scan signal, and the seventh input signal is the $(i-2)^{th}$ stage scan signal.

In one or more embodiments of the invention, when i is an even number greater than or equal to 3 and smaller than or equal to N, the third input signal is the precharge signal at the node of the $(i-1)^{th}$ stage shift register, the fourth input signal is the $(i-1)^{th}$ stage scan signal, the fifth input signal is the precharge signal at the node of the $i^{th}$ stage shift register, the sixth input signal the $i^{th}$ stage scan signal, and the seventh input signal is the $(i-3)^{th}$ stage scan signal.

In one or more embodiments of the invention, when i is from 3 to N, the $i^{th}$ stage shift register further includes a reset unit which coupled to the precharge unit and the pull-up unit. The reset unit is configured to reset a level at the node of the $i^{th}$ stage shift register before the scan signals are generated. The reset unit includes a fourteenth transistor. A gate of the fourteenth transistor is configured to receive the starting signal, one of a source and a drain of the fourteenth transistor is configured to receive a reference voltage, and the other of the source and the drain of the fourteenth transistor is coupled to the node.

In one or more embodiments of the invention, wherein the $k^{th}$ stage scan signal is inputted to the pull-down unit of the $(k+1)^{th}$ stage shift register, and the $(k+1)^{th}$ stage scan signal is inputted to the pull-down unit of the $k^{th}$ stage shift register, where k is an odd number.

In one or more embodiments of the invention, the clock signals respectively of adjacent two stage shift registers of the shift registers differ by ¼ clock period of the clock signals in phase.

In one or more embodiments of the invention, the pull-down control signals respectively of adjacent two stage shift registers of the shift registers are substantially phase-inverted from each other.

Another aspect of the invention is directed to a display apparatus which includes a display panel and a gate driving circuit. The driving circuit is configured for driving the display panel and includes $1^{st}$ to $N^{th}$ stage first shift registers for respectively generating and sequentially outputting $1^{st}$ to $N^{th}$ stage scan signals to the display panel, where N is an integer greater than or equal to 4. Each of the shift registers is configured to receive a starting signal, and the starting signal is utilized to trigger the $1^{st}$ and $2^{nd}$ stage shift registers to generate the $1^{st}$ and $2^{nd}$ stage scan signals respectively, and is utilized to reset the $3^{rd}$ to $N^{th}$ stage shift registers.

In one or more embodiments of the invention, the $i^{th}$ stage scan signal is further configured to reset the $(i-j)^{th}$ stage shift register, where i is an integer from 4 to N, and j is an integer greater than 2 and smaller than i.

Another aspect of the invention is directed to a display apparatus which includes a display panel, a first gate driving circuit and a second gate driving circuit. The first gate driving circuit is disposed at one side of the display panel for driving the display panel and includes $1^{st}$ to $N^{th}$ stage first shift registers for respectively generating and sequentially outputting $1^{st}$ to $N^{th}$ stage first scan signals to the display panel, where N is an integer greater than or equal to 4. Each of the first shift registers is configured to receive a first starting signal, and the first starting signal is utilized to trigger the $1^{st}$ and $2^{nd}$ stage first shift registers to generate the $1^{st}$ and $2^{nd}$ stage first scan signals respectively, and is utilized to reset the $3^{rd}$ to $N^{th}$ stage first shift registers. The second gate driving circuit is disposed at an opposite side of the display panel for driving the display panel and includes $1^{st}$ to $N^{th}$ stage second shift registers for respectively generating and sequentially outputting $1^{st}$ to $N^{th}$ stage second scan signals to the display panel. Each of the second shift registers is configured to receive a second starting signal, and the second starting signal is utilized to trigger the $1^{st}$ and $2^{nd}$ stage second shift registers to generate the $1^{st}$ and $2^{nd}$ stage second scan signals, respectively, and is utilized to reset the $3^{rd}$ to $N^{th}$ stage second shift registers.

In one or more embodiments of the invention, the $i^{th}$ stage first scan signal is further configured to reset the $(i-j)^{th}$ stage first shift register, and the $i^{th}$ stage second scan signal is further configured to reset the $(i-j)^{th}$ stage second shift register, wherein i is an integer from 4 to N, and j is an integer greater than 2 and smaller than i.

In one or more embodiments of the invention, time sequences of the first scan signals are the same as time sequences of the second scan signals, respectively.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

DETAILED DESCRIPTION

The detailed explanation of the invention is described as following. The described preferred embodiments are presented for purposes of illustrations and description, and they are not intended to limit the scope of the invention.

Figure 1:
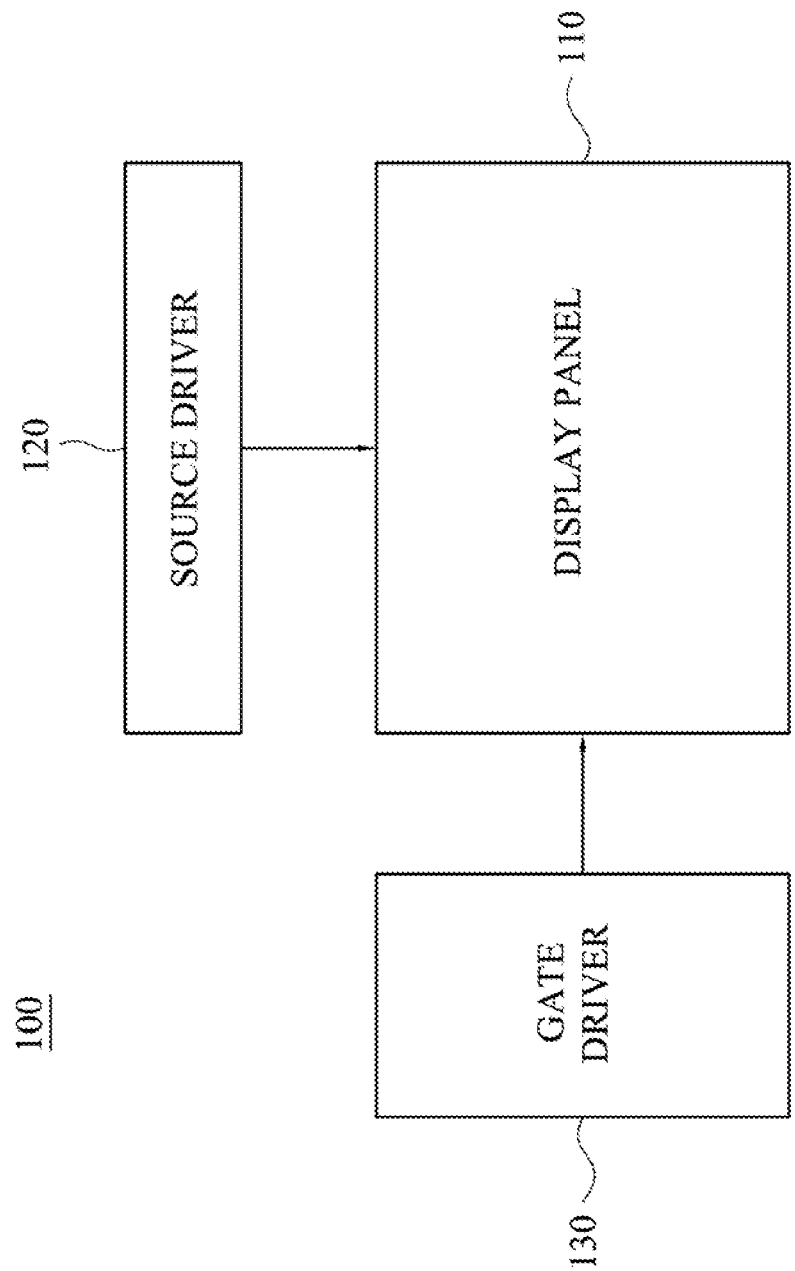
FIG. 1 is a schematic diagram of a display apparatus in accordance with some embodiments of the invention.

FIG. 1 is a schematic diagram of a display apparatus 100 in accordance with some embodiments of the invention. The display apparatus 100 may be, for example, a liquid crystal display (LCD) apparatus of twisted nematic (TN) mode, in-plane switching (IPS) mode, fringe-field switching (FFS) mode, vertical alignment (VA) mode or other different modes, or an organic light-emitting diode (OLED) display apparatus, but embodiments of the invention are not limited thereto. The display apparatus 100 includes a display panel 110, a source driver 120 and a gate driver 130. The display panel 110 includes pixels arranged in a matrix for collectively displaying an image. The source driver 120 is electrically connected to the display panel 110, and is configured to convert image data into source driving signals and transmit the source driving signals to the display panel 110. The gate driver 130 is configured to generate and transmit gate driving signals to the display panel 110. The display panel 110 displays an image by the driving of the source driving signals and the gate driving signals. In some embodiments, as shown in FIG. 1, the source driver 120 and the gate driver 130 are disposed outside of the display panel 110. In another embodiment, the display panel 110 is a system on glass (SOG) panel, and the source driver 120 and the gate driver 130 are implemented in the display panel 110.

Figure 2A:
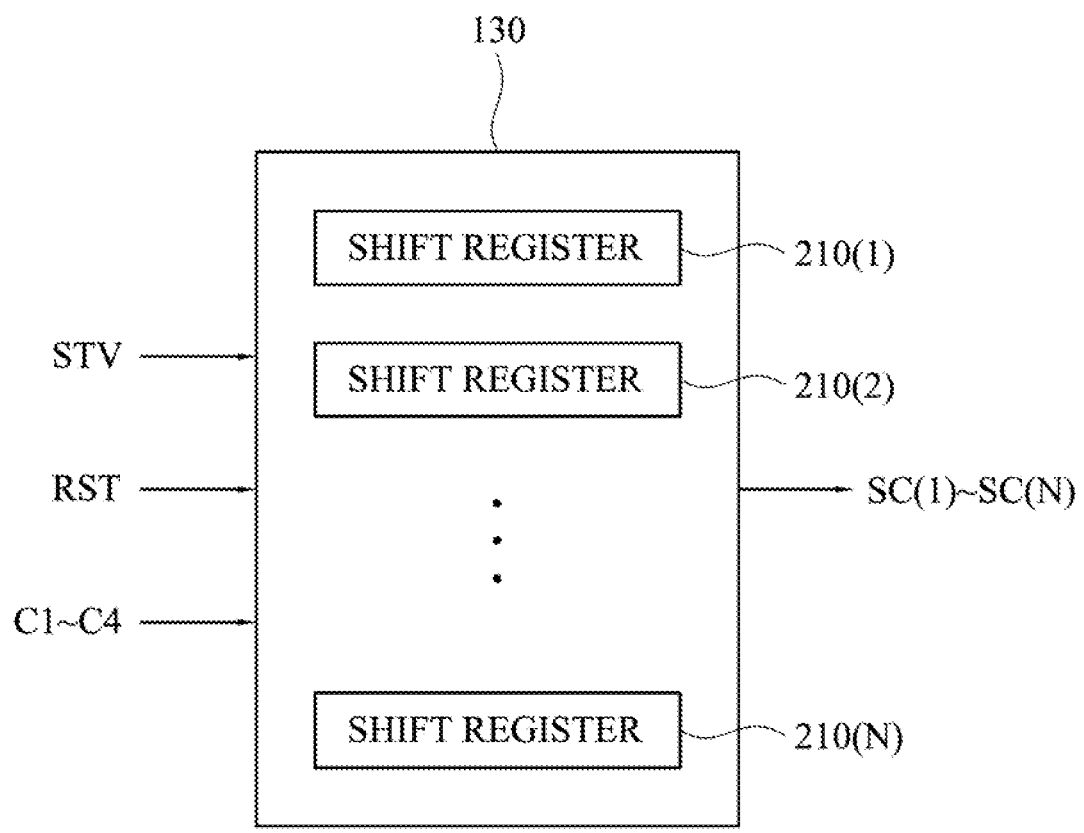
FIG. 2A and FIG. 2B are block diagrams showing the gate driver of FIG. 1.
Figure 2B:
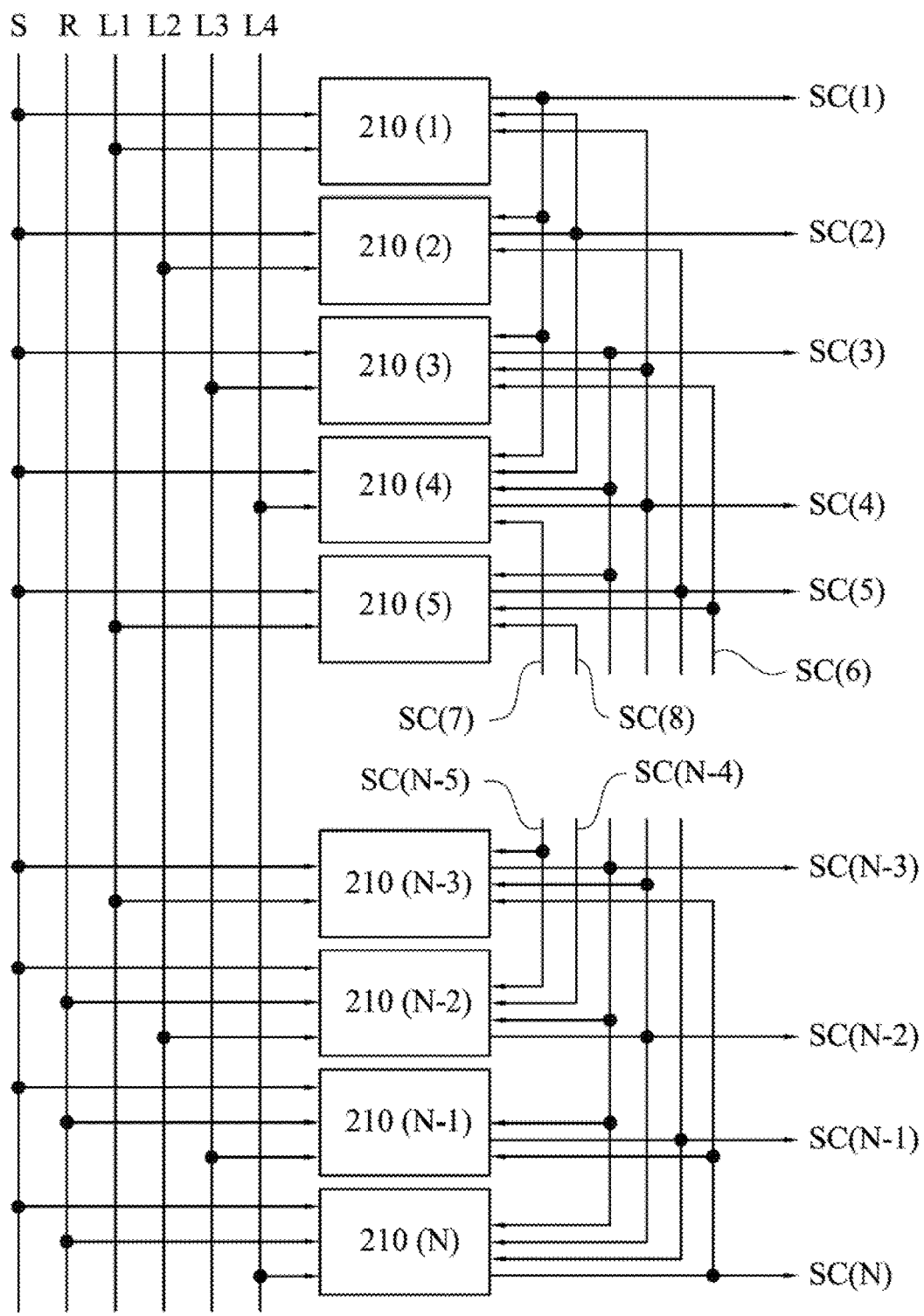

FIG. 2A and FIG. 2B are block diagrams showing the gate driver 130 of FIG. 1. As shown in FIG. 2A, the gate driver 130 receives clock signals C1-C4, a starting signal STV and an ending signal RST, and includes $1^{st}$ to $N^{th}$ stage shift registers 210(1)-210(N), where N is an integer greater than or equal to 4. Furthermore, N is an even number greater than 4, and every adjacent two stage shift registers of the shift register 210(1)-210(N) are coupled to each other. The shift registers 210(1)-210(N) are configured to generate $1^{st}$ to $N^{th}$ stage scan signals SC(1)-SC(N) based on the clock signals C1-C4, the starting signal STV and the ending signal RST, respectively, and to output the $1^{st}$ to $N^{th}$ stage scan signals SC(1)-SC(N) to scan lines (not shown) of the display panel 110, respectively. In FIG. 2B, clock signal lines L1-L4 respectively provide the clock signals C1-C4 to the corresponding shift register 210(1)-210(N) in a sequential order of the clock signals C1-C4, where the clock signal C2 and the clock signal C1 differ by ¼ clock period in phase, the clock signal C3 and the clock signal C2 differ by ¼ clock period in phase, and the clock signal C4 and the clock signal C3 differ by ¼ clock period in phase. In addition, a starting signal line S is configured to provide the starting signal STV to the $1^{st}$ to $N^{th}$ stage shift registers 210(1)-210(N), and an ending signal line R is configured to provide the ending signal RST to the $(N-2)^{th}$ to $N^{th}$ stage shift registers 210(N-2)-210(N). The starting signal S is utilized to trigger the $1^{st}$ and $2^{nd}$ stage shift registers 210(1) and 210(2) to generate the $1^{st}$ and $2^{nd}$ stage scan signals SC(1) and SC(2) respectively, and the starting signal S is utilized to reset the $3^{rd}$ to $N^{th}$ stage shift registers 210(3)-210(N), which will be discussed in detail later. The $1^{st}$ to $N^{th}$ stage shift registers 210(1)-210(N) are configured to generate $1^{st}$ to $N^{th}$ stage scan signals SC(1)-SC(N) and output the $1^{st}$ to $N^{th}$ stage scan signals SC(1)-SC(N) to scan lines (not shown) of the display panel 110, respectively. The coupling relations between the $1^{st}$ to $N^{th}$ stage shift registers 210(1)-210(N) will be described in the discussion of FIGS. 3A-4B.

Figure 3A:
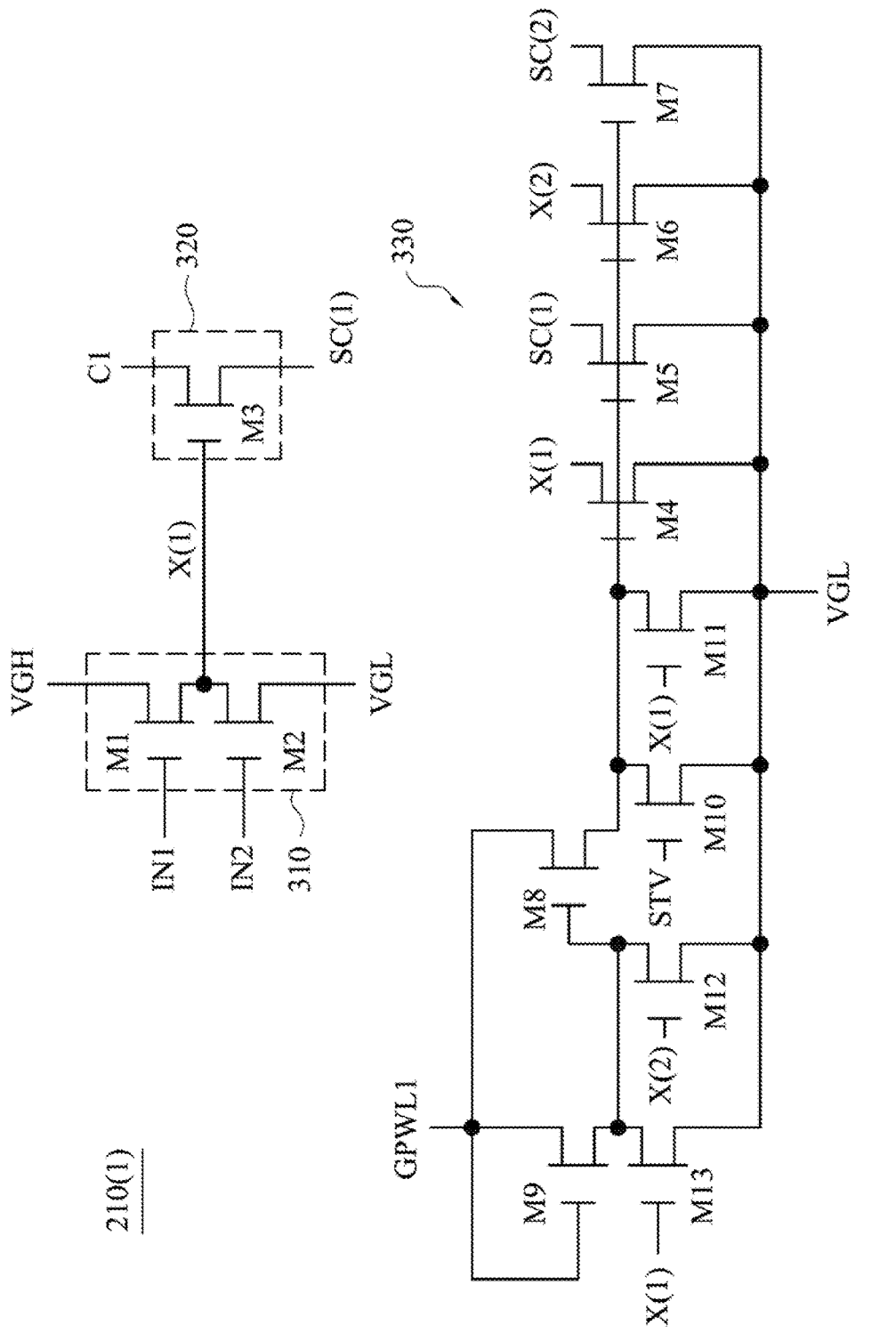
FIG. 3A and FIG. 3B are respective circuit diagrams of the $1^{st}$ stage shift register and the $2^{nd}$ stage shift register of FIG. 2A and FIG. 2B.
Figure 3B:
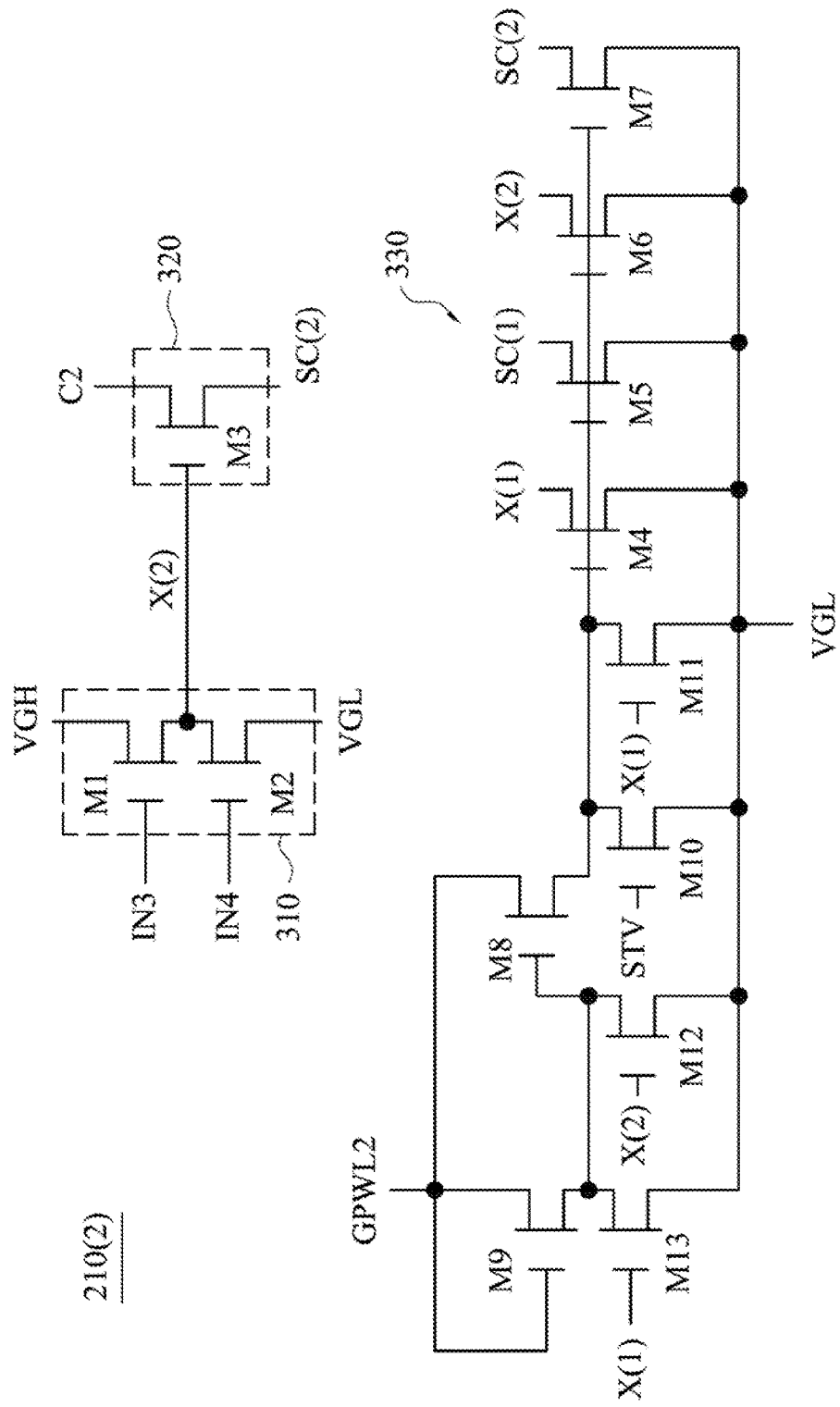

FIG. 3A and FIG. 3B are respective circuit diagrams of the $1^{st}$ stage shift register 210(1) and the $2^{nd}$ stage shift register 210(2) of FIG. 2A and FIG. 2B. Each of the $1^{st}$ stage shift register 210(1) and the $2^{nd}$ stage shift register 210(2) includes a precharge unit 310, a pull-up unit 320 and a pull-down unit 330.

In the $1^{st}$ stage shift register 210(1) of FIG. 3A, the precharge unit 310 is configured to receive input signals IN1 and IN2 and output a precharge signal via a node X(1) based on the input signals IN1 and IN2. The input signals IN1-IN2 of the $1^{st}$ shift register 210(1) are the starting signal STV and the $(1+j)^{th}$ stage scan signal SC(1+j), respectively, where j is an integer greater than 2. The precharge unit 310 includes transistors M1 and M2. The first terminal of the transistor M1 is configured to receive the starting signal STV, the second terminal of the transistor M1 is configured to receive a reference voltage VGH, and the third terminal of the transistor M1 is coupled to the node X(1). The first terminal of the transistor M2 is configured to receive the $(1+j)^{th}$ stage scan signal SC(1+j), the second terminal of the transistor M2 is configured to receive a reference voltage VGL, and the third terminal of the transistor M2 is coupled to the node X(1). The levels of the reference voltages VGH and VGL are high and low relative to each other. In this embodiment, for each of the transistors shown in FIG. 3A to FIG. 4B, the first terminal is the gate, the second terminal is one of the source and the drain, and the third terminal is the other of the source and the drain.

In the $1^{st}$ stage shift register 210(1) of FIG. 3A, the pull-up unit 320 is coupled to the precharge unit 310, and is configured to receive the precharge signal and the clock signal C1 and output the $1^{st}$ stage scan signal SC(1) based on the precharge signal and the clock signal C1. The pull-up unit 320 includes a transistor M3. The first terminal of the transistor M3 is coupled to the node X(1), the second terminal of the transistor M3 is configured to receive the clock signal C1, and the third terminal of the transistor M3 is configured to output the $1^{st}$ stage scan signal SC(1).

In the $1^{st}$ stage shift register 210(1) of FIG. 3A, the pull-down unit 330 is coupled to the precharge unit 310 and the pull-up unit 320, and is configured to receive the precharge signal and a pull-down control signal GPWL1 and control the level of the $1^{st}$ stage scan signal SC(1) based on the precharge signal and the pull-down control signal GPWL1. The pull-down unit 330 includes transistors M4-M13. The second terminal of the transistor M4 is configured to receive the reference voltage VGL, and the third terminal of the transistor M4 is coupled to the node X(1) for receiving the precharge signal. The first terminal of the transistor M5 is coupled to the first terminal of the transistor M4, the second terminal of the transistor M5 is configured to receive the reference voltage VGL, and the third terminal of the transistor M5 is configured to receive the $1^{st}$ stage scan signal SC(1). The first terminal of the transistor M6 is coupled to the first terminal of the transistor M4, the second terminal of the transistor M6 is configured to receive the reference voltage VGL, and the third terminal of the transistor M6 is coupled to a node X(2) of the $2^{nd}$ stage shift register 210(2) for receiving a precharge signal from the $2^{nd}$ stage shift register 210(2). The first terminal of the transistor M7 is coupled to the first terminal of the transistor M4, the second terminal of the transistor M7 is configured to receive the reference voltage VGL, and the third terminal of the transistor M7 is configured to receive the $2^{nd}$ stage scan signal SC(2). The second terminal of the transistor M8 is configured to receive the pull-down control signal GPWL1, and the third terminal of the transistor M8 is coupled to the first terminal of the transistor M4. The first terminal and second terminal of the transistor M9 are configured to receive the pull-down control signal GPWL1, and the third terminal of the transistor M9 is coupled to the first terminal of the transistor M8. The first terminal of the transistor M10 is configured to receive the starting signal STV, the second terminal of the transistor M10 is configured to receive the reference voltage VGL, and the third terminal of the transistor M10 is coupled to the first terminal of the transistor M4. The first terminal of the transistor M11 is coupled to the node X(1) for receiving the precharge signal, the second terminal of the transistor M11 is configured to receive the reference voltage VGL, and the third terminal of the transistor M11 is coupled to the first terminal of the transistor M4. The first terminal of the transistor M12 is coupled to the node X(2) of the $2^{nd}$ stage shift register 210(2) for receiving the precharge signal of the $2^{nd}$ stage shift register 210(2), the second terminal of the transistor M12 is configured to receive the reference voltage VGL, and the third terminal of the transistor M12 is coupled to the first terminal of the transistor M8. The first terminal of the transistor M13 is coupled to the node X(1) for receiving the precharge signal, the second terminal of the transistor M13 is configured to receive the reference voltage VGL, and the third terminal of the transistor M13 is coupled to the first terminal of the transistor M8.

In the $2^{nd}$ stage shift register 210(2) of FIG. 3B, the precharge unit 310 is configured to receive the input signals IN3 and IN4 and output a precharge signal based on the input signals IN3 and IN4. The input signals IN3-IN4 of the $2^{nd}$ shift register 210(2) are the starting signal STV and the $(2+j)^{th}$ stage scan signal SC(2+j), where j is an integer greater than 2. The first terminal of the transistor M1 is configured to receive the starting signal STV, the second terminal of the transistor M1 is configured to receive a reference voltage VGH, and the third terminal of the transistor M1 is coupled to the node X(2). The first terminal of the transistor M2 is configured to receive the $(2+j)^{th}$ stage scan signal SC(2+j), the second terminal of the transistor M2 is configured to receive a reference voltage VGL, and the third terminal of the transistor M2 is coupled to the node X(2).

In the $2^{nd}$ stage shift register 210(2) of FIG. 3B, the pull-up unit 320 is coupled to the precharge unit 310, and is configured to receive the precharge signal and the clock signal C2 and output the $2^{nd}$ stage scan signal SC(2) based on the precharge signal and the clock signal C2. The first terminal of the transistor M3 is coupled to the node X(2), the second terminal of the transistor M3 is configured to receive the dock signal C2, and the third terminal of the transistor M3 is configured to output the $2^{nd}$ stage scan signal SC(2).

In the $2^{nd}$ stage shift register 210(2) of FIG. 3B, the pull-down unit 330 is coupled to the precharge unit 310 and the pull-up unit 320, and is configured to receive the precharge signal and a pull-down control signal GPWL2 and control the level of the $2^{nd}$ stage scan signal SC(2) based on the precharge signal and the pull-down control signal GPWL2. The pull-down control signals GPWL1 and GPWL2 are phase-inverted from each other. The second terminal of the transistor M4 is configured to receive the reference voltage VGL, and the third terminal of the transistor M4 is coupled to the node X(1) of the $1^{st}$ stage shift register 210(1) for receiving the precharge signal of the $1^{st}$ stage shift register 210(1). The first terminal of the transistor M5 is coupled to the first terminal of the transistor M4, the second terminal of the transistor M5 is configured to receive the reference voltage VGL, and the third terminal of the transistor M5 is configured to receive the $1^{st}$ stage scan signal SC(1). The first terminal of the transistor M6 is coupled to the first terminal of the transistor M4, the second terminal of the transistor M6 is configured to receive the reference voltage VGL, and the third terminal of the transistor M6 is coupled to the node X(2) for receiving the precharge signal. The first terminal of the transistor M7 is coupled to the first terminal of the transistor M4, the second terminal of the transistor M7 is configured to receive the reference voltage VGL, and the third terminal of the transistor M7 is configured to receive the $2^{nd}$ stage scan signal SC(2). The second terminal of the transistor M8 is configured to receive the pull-down control signal GPWL2, and the third terminal of the transistor M8 is coupled to the first terminal of the transistor M4. The first terminal and second terminal of the transistor M9 are configured to receive the pull-down control signal GPWL2, and the third terminal of the transistor M9 is coupled to the first terminal of the transistor M8. The first terminal of the transistor M10 is configured to receive the starting signal STV, the second terminal of the transistor M10 is configured to receive the reference voltage VGL, and the third terminal of the transistor M10 is coupled to the first terminal of the transistor M4. The first terminal of the transistor M11 is coupled to the node X(1) of the $1^{st}$ stage shift register 210(1) for receiving the precharge signal of the $1^{st}$ stage shift register 210(1), the second terminal of the transistor M11 is configured to receive the reference voltage VGL, and the third terminal of the transistor M11 is coupled to the first terminal of the transistor M4. The first terminal of the transistor M12 is coupled to the node X(2) for receiving the precharge signal, the second terminal of the transistor M12 is configured to receive the reference voltage VGL, and the third terminal of the transistor M12 is coupled to the first terminal of the transistor M8. The first terminal of the transistor M13 is coupled to the node X(1) of the $1^{st}$ stage shift register 210(1) for receiving the precharge signal of the $1^{st}$ stage shift register 210(1), the second terminal of the transistor M13 is configured to receive the reference voltage VGL, and the third terminal of the transistor M13 is coupled to the first terminal of the transistor M8.

Figure 4A:
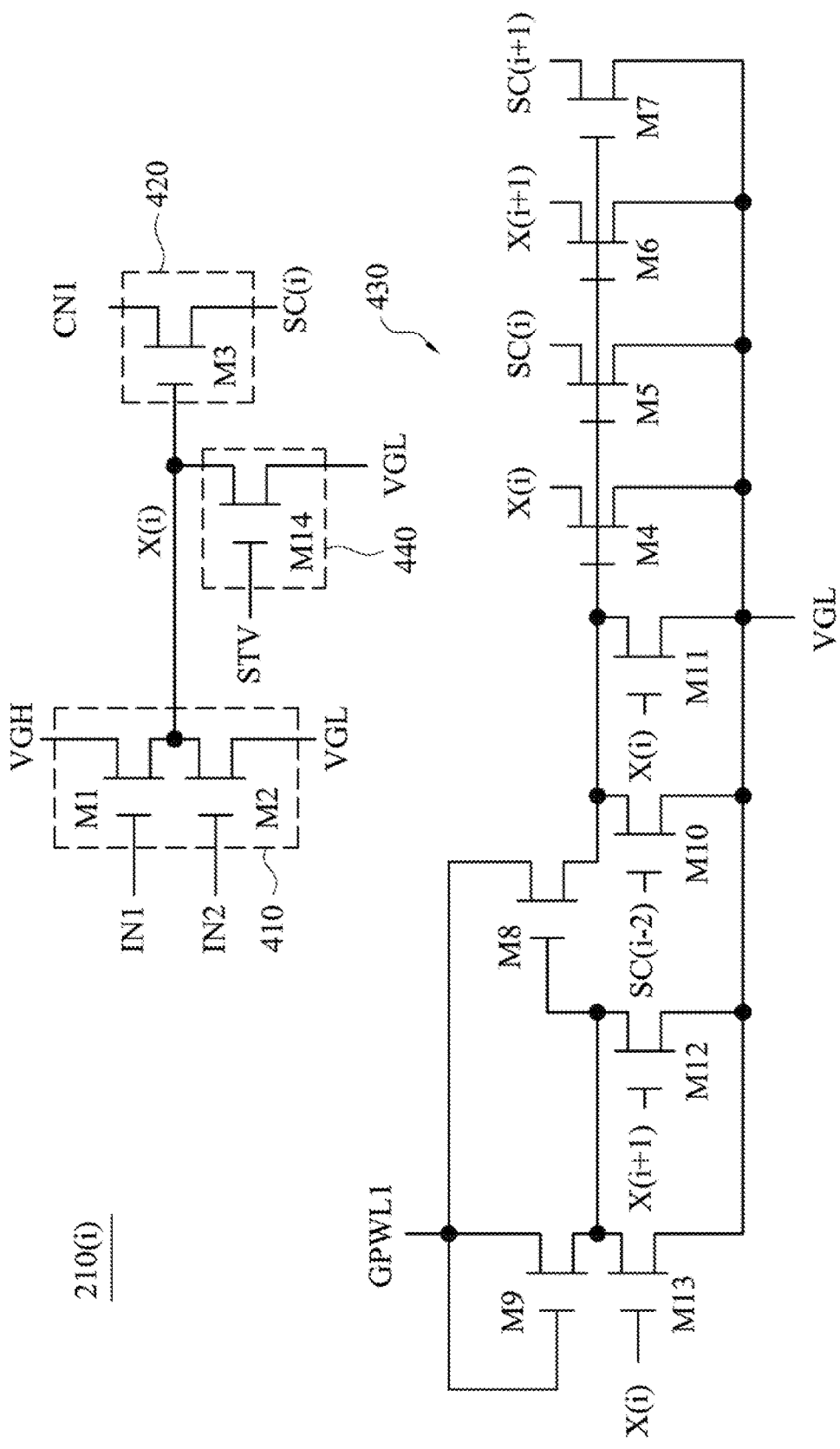
FIG. 4A and FIG. 4B are respective circuit diagrams of the $i^{th}$ stage shift register and the $(i+1)^{th}$ stage shift register of FIG. 2A and FIG. 2B.
Figure 4B:
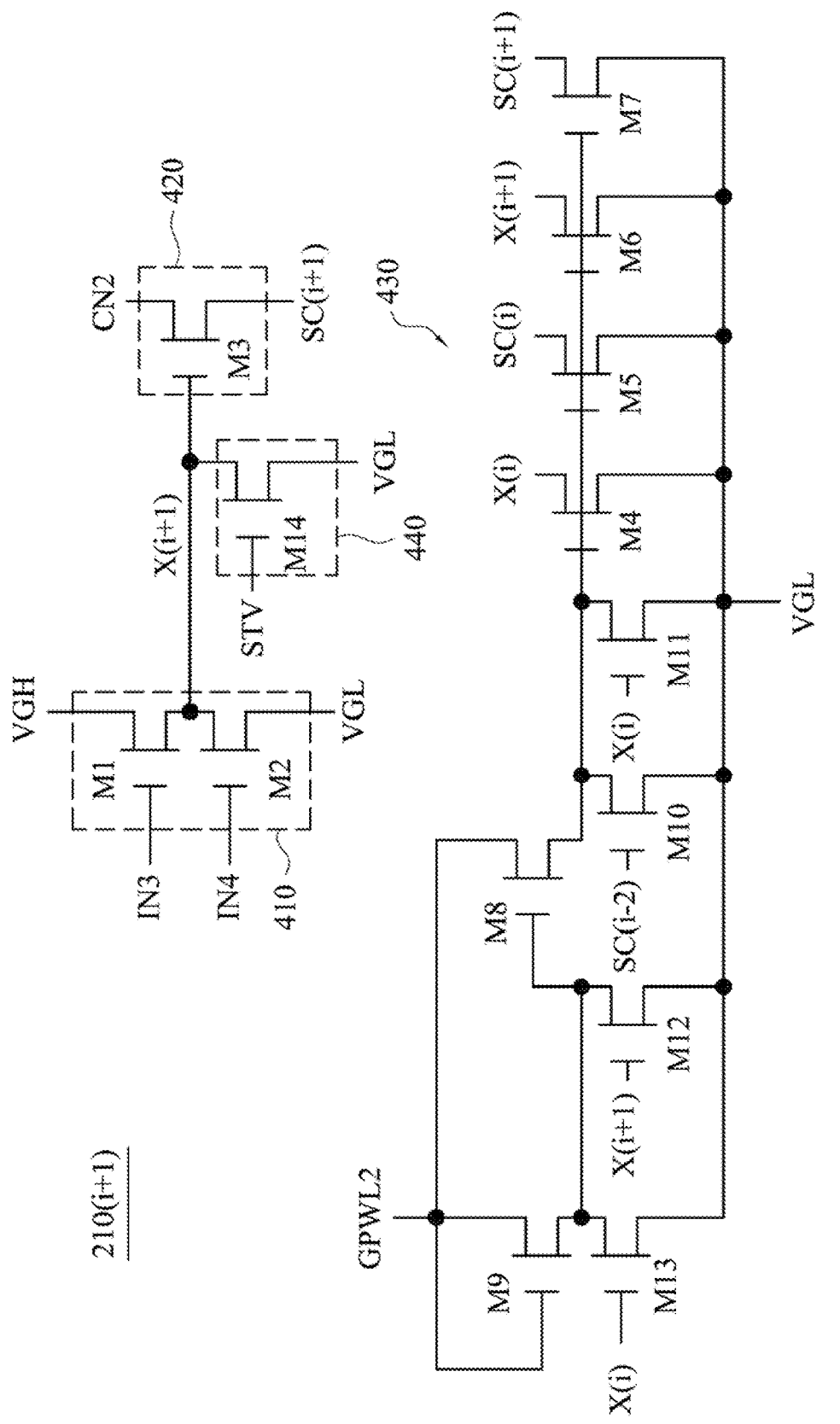

FIG. 4A and FIG. 4B are respective circuit diagrams of the $i^{th}$ stage shift register 210(i) and the $(i+1)^{th}$ stage shift register 210(i+1) of FIG. 2A and FIG. 2B, where i is an odd integer from 3 to (N−1). Each of the $i^{th}$ stage shift register 210(i) and the $(i+1)^{th}$ stage shift register 210(i+1) includes a precharge unit 410, a pull-up unit 420, a pull-down unit 430 and a reset unit 440, where the electrical circuit components of the precharge unit 410, the pull-up unit 420 and the pull-down unit 430 corresponds to those of the precharge unit 310, the pull-up unit 320 and the pull-down unit 330, respectively.

In the $i^{th}$ stage shift register 210(i) of FIG. 4A, the precharge unit 410 is configured to receive input signals IN1 and IN2 and output a precharge signal via a node X(i) based on the input signals IN1 and IN2. If the $i^{th}$ shift register 210(i) is an odd-numbered stage shift register where i is an odd integer greater than 2 and smaller than or equal to (N−j), the input signals IN1-IN2 of the shift register 210(i) are the $(i−2)^{th}$ stage scan signal SC(i−2) and the $(i+j)^{th}$ stage scan signal SC(i+j), respectively. If the $i^{th}$ shift register 210(i) is an odd-numbered stage shift register where i is an odd integer greater than (N−j), the input signals IN1-IN2 of the shift register 210(i) are the $(i−2)^{th}$ stage scan signal SC(i−2) and the ending signal RST, respectively. The first terminal of the transistor M1 is configured to receive the input signal IN1, the second terminal of the transistor M1 is configured to receive a reference voltage VGH, and the third terminal of the transistor M1 is coupled to the node X(i). The first terminal of the transistor M2 is configured to receive the input signal IN2, the second terminal of the transistor M2 is configured to receive a reference voltage VGL, and the third terminal of the transistor M2 is coupled to the node X(i).

In the $i^{th}$ stage shift register 210(i) of FIG. 4A, the pull-up unit 420 is coupled to the precharge unit 410, and is configured to receive the precharge signal and a clock signal CN1 and output the $i^{th}$ stage scan signal SC(i) based on the precharge signal and the clock signal CN1. The first terminal of the transistor M3 is coupled to the node X(i), the second terminal of the transistor M3 is configured to receive the clock signal CN1, and the third terminal of the transistor M3 is configured to output the $i^{th}$ stage scan signal SC(i). If (i+1) is a multiple of 4, the clock signal CN1 is the clock signal C3 of FIG. 2A. Oppositely, if (i+1) is not a multiple of 4, the clock signal CN1 is the clock signal C1 of FIG. 2A.

In the $i^{th}$ stage shift register 210(i) of FIG. 4A, the pull-down unit 430 is coupled to the precharge unit 410 and the pull-up unit 420, and is configured to receive the precharge signal and the pull-down control signal GPWL1 and control the level of the $i^{th}$ stage scan signal SC(i) based on the precharge signal and the pull-down control signal GPWL1. The second terminal of the transistor M4 is configured to receive the reference voltage VGL, and the third terminal of the transistor M4 is coupled to the node X(i) for receiving the precharge signal. The first terminal of the transistor M5 is coupled to the first terminal of the transistor M4, the second terminal of the transistor M5 is configured to receive the reference voltage VGL, and the third terminal of the transistor M5 is configured to receive the $i^{th}$ stage scan signal SC(i). The first terminal of the transistor M6 is coupled to the first terminal of the transistor M4, the second terminal of the transistor M6 is configured to receive the reference voltage VGL, and the third terminal of the transistor M6 is coupled to a node X(i+1) of the $(i+1)^{th}$ stage shift register 210(i+1) for receiving a precharge signal of the $(i+1)^{th}$ stage shift register 210(i+1). The first terminal of the transistor M7 is coupled to the first terminal of the transistor M4, the second terminal of the transistor M7 is configured to receive the reference voltage VGL, and the third terminal of the transistor M7 is configured to receive the $(i+1)^{th}$ stage scan signal SC(i+1). The second terminal of the transistor M8 is configured to receive the pull-down control signal GPWL1, and the third terminal of the transistor M8 is coupled to the first terminal of the transistor M4. The first terminal and second terminal of the transistor M9 are configured to receive the pull-down control signal GPWL1, and the third terminal of the transistor M9 is coupled to the first terminal of the transistor M8. The first terminal of the transistor M10 is configured to receive the $(i-2)^{th}$ stage scan signal SC(i-2), the second terminal of the transistor M10 is configured to receive the reference voltage VGL, and the third terminal of the transistor M10 is coupled to the first terminal of the transistor M4. The first terminal of the transistor M11 is coupled to the node X(i) for receiving the precharge signal, the second terminal of the transistor M11 is configured to receive the reference voltage VGL, and the third terminal of the transistor M11 is coupled to the first terminal of the transistor M4. The first terminal of the transistor M12 is coupled to the node X(i+1) of the $(i+1)^{th}$ stage shift register 210(i+1) for receiving the precharge signal of the $(i+1)^{th}$ stage shift register 210(i+1), the second terminal of the transistor M12 is configured to receive the reference voltage VGL, and the third terminal of the transistor M12 is coupled to the first terminal of the transistor M8. The first terminal of the transistor M13 is coupled to the node X(i) for receiving the precharge signal, the second terminal of the transistor M13 is configured to receive the reference voltage VGL, and the third terminal of the transistor M13 is coupled to the first terminal of the transistor M8.

In the $i^{th}$ stage shift register 210(i) of FIG. 4A, the reset unit 440 is coupled to the precharge unit 410 and the pull-up unit 420, and is configured to receive the starting signal STV and reset the level of the node X(i) based on the starting signal STV (i.e. reset the precharge signal). The first terminal of the transistor M14 is configured to receive the starting signal STV, the second terminal of the transistor M14 is configured to receive the reference voltage VGL, and the third terminal of the transistor M14 is coupled to the node X(i).

In the $(i+1)^{th}$ stage shift register 210(i+1) of FIG. 4B, the precharge unit 410 is configured to receive input signals IN3 and IN4 and output a precharge node via a node X(i+1) based on the input signals IN3 and IN4. If the $(i+1)^{th}$ shift register 210(i+1) is an even-numbered stage shift register where (i+1) is an even integer greater than 2 and smaller than or equal to (N−j), the input signals IN3-IN4 of the shift register 210(i+1) are the $(i-1)^{th}$ stage (i.e. $((i+1)-2)^{th}$ stage) scan signal SC(i−1) and the $(i+j+1)^{th}$ stage (i.e. $((i+1)+j)^{th}$ stage) scan signal SC(i+j+1), respectively. If the $(i+1)^{th}$ shift register 210(i+1) is an even-numbered stage shift register where (i+1) is an even integer greater than (N−j), the input signals IN3-IN4 of the shift register 210(k) are the $(i-1)^{th}$ stage scan signal SC(i−1) and the ending signal RST, respectively. The first terminal of the transistor M1 is configured to receive the input signal IN3, the second terminal of the transistor M1 is configured to receive the reference voltage VGH, and the third terminal of the transistor M1 is coupled to the node X(i+1). the first terminal of the transistor M2 is configured to receive the input signal IN4, the second terminal of the transistor M2 is configured to receive a reference voltage VGL, and the third terminal of the transistor M2 is coupled to the node X(i+1).

In the $(i+1)^{th}$ stage shift register 210(i+1) of FIG. 4B, the pull-up unit 420 is coupled to the precharge unit 410, and is configured to receive the precharge signal and a clock signal CN2 and output the $(i+1)^{th}$ stage scan signal SC(i+1) based on the precharge signal and the clock signal CN2. The first terminal of the transistor M3 is coupled to the node X(i+1), the second terminal of the transistor M3 is configured to receive the clock signal C2, and the third terminal of the transistor M3 is configured to output the $(i+1)^{th}$ stage scan signal SC(i+1). If (i+1) is a multiple of 4, the clock signal CN2 is the dock signal C4 of FIG. 2A. Oppositely, if (i+1) is not a multiple of 4, the clock signal CN2 is the clock signal C2 of FIG. 2A.

In the $(i+1)^{th}$ stage shift register 210(i+1) of FIG. 4B, the pull-down unit 430 is coupled to the precharge unit 410 and the pull-up unit 420, and is configured to receive the precharge signal and the pull-down control signal GPWL2 and control the level of the $(i+1)^{th}$ stage scan signal SC(i+1) based on the precharge signal and the pull-down control signal GPWL2. The second terminal of the transistor M4 is configured to receive the reference voltage VGL, and the third terminal of the transistor M4 is coupled to the node X(i) of the $i^{th}$ stage shift register 210(i) for receiving the precharge signal of the $i^{th}$ stage shift register 210(i). The first terminal of the transistor M5 is coupled to the first terminal of the transistor M4, the second terminal of the transistor M5 is configured to receive the reference voltage VGL, and the third terminal of the transistor M5 is configured to receive the $i^{th}$ stage scan signal SC(i). The first terminal of the transistor M6 is coupled to the first terminal of the transistor M4, the second terminal of the transistor M6 is configured to receive the reference voltage VGL, and the third terminal of the transistor M6 is coupled to the node X(i+1) for receiving the precharge signal. The first terminal of the transistor M7 is coupled to the first terminal of the transistor M4, the second terminal of the transistor M7 is configured to receive the reference voltage VGL, and the third terminal of the transistor M7 is configured to receive the $(i+1)^{th}$ stage scan signal SC(i+1). The second terminal of the transistor M8 is configured to receive the pull-down control signal GPWL2, and the third terminal of the transistor M8 is coupled to the first terminal of the transistor M4. The first terminal and second terminal of the transistor M9 are configured to receive the pull-down control signal GPWL2, and the third terminal of the transistor M9 is coupled to the first terminal of the transistor M8. The first terminal of the transistor M10 is configured to receive the $(i-2)^{th}$ stage scan signal SC(i-2), the second terminal of the transistor M10 is configured to receive the reference voltage VGL, and the third terminal of the transistor M10 is coupled to the first terminal of the transistor M4. The first terminal of the transistor M11 is coupled to the node X(i) of the $i^{th}$ stage shift register 210(i) for receiving the precharge signal of the $i^{th}$ stage shift register 210(i), the second terminal of the transistor M11 is configured to receive the reference voltage VGL, and the third terminal of the transistor M11 is coupled to the first terminal of the transistor M4. The first terminal of the transistor M12 is coupled to the node X(i+1) for receiving the precharge signal, the second terminal of the transistor M12 is configured to receive the reference voltage VGL, and the third terminal of the transistor M12 is coupled to the first terminal of the transistor M8. The first terminal of the transistor M13 is coupled to the node X(i) of the $i^{th}$ stage shift register 210(i) for receiving the precharge signal of the $i^{th}$ stage shift register 210(i), the second terminal of the transistor M13 is configured to receive the reference voltage VGL, and the third terminal of the transistor M13 is coupled to the first terminal of the transistor M8.

In the $(i+1)^{th}$ stage shift register 210(i+1) of FIG. 4B, the reset unit 440 is coupled to the precharge unit 410 and the pull-up unit 420, and is configured to receive the starting signal STV and reset the level of the node X(i+1) based on the starting signal STV (i.e. reset the precharge signal). The first terminal of the transistor M14 is configured to receive the starting signal STV, the second terminal of the transistor M14 is configured to receive the reference voltage VGL, and the third terminal of the transistor M14 is coupled to the node X(i+1).

Referring to FIGS. 3A-4B, the input signals IN1-IN2 of the $1^{st}$ shift register 210(1) are the starting signal STV and the $(1+j)^{th}$ stage scan signal SC(1+j), respectively. If the $k^{th}$ shift register 210(k) is an odd-numbered stage shift register where k is an odd integer greater than 2 and smaller than or equal to (N-j), the input signals IN1-IN2 of the shift register 210(k) are the $(k-2)^{th}$ stage scan signal SC(k-2) and the $(k+j)^{th}$ stage scan signal SC(k+j), respectively. If the $k^{th}$ shift register 210(k) is an odd-numbered stage shift register where k is an odd integer greater than (N-j), the input signals IN1-IN2 of the shift register 210(k) are the $(k-2)^{th}$ stage scan signal SC(k-2) and the ending signal RST, respectively.

Similarly, the input signals IN3-IN4 of the $2^{nd}$ shift register 210(2) are the starting signal STV and the $(2+j)^{th}$ stage scan signal SC(2+j), respectively. If the $k^{th}$ shift register 210(k) is an even-numbered stage shift register where k is an even integer greater than 2 and smaller than or equal to (N-j), the input signals IN3-IN4 of the shift register 210(k) are the $(k-2)^{th}$ stage scan signal SC(k-2) and the $(k+j)^{th}$ stage scan signal SC(k+j), respectively. If the $k^{th}$ shift register 210(k) is an even-numbered stage shift register where k is an even integer greater than (N-j), the input signals IN3-IN4 of the shift register 210(k) are the $(k-2)^{th}$ stage scan signal SC(k-2) and the ending signal RST, respectively.

In brief, when i is 1 or 2, the input signals (e.g. IN1-IN2 or IN3-IN4) of the $i^{th}$ stage shift register 210(i) are respectively the starting signal STV and the $(i+j)^{th}$ m stage scan signal SC(i+j), where j is an integer greater than 2. When i is from 3 to (N-j), the input signals (e.g. IN1-IN2 or IN3-IN4) of the $i^{th}$ stage shift register 210(i) are the $(i-2)^{th}$ stage scan signal SC(i-2) and the $(i+j)^{th}$ stage scan signal SC(i+j), respectively. When i is from (N-j+1) to N, the input signals (e.g. IN1-IN2 or IN3-IN4) of the $i^{th}$ stage shift register 210(i) are the $(i-2)^{th}$ stage scan signal SC(i-2) and the ending signal RST, respectively.

For example, in the case of N=1024 and j=3, when i is 1 or 2, the input signals (e.g. IN1-IN2 or IN3-IN4) of the $i^{th}$ stage shift register 210(i) are respectively the starting signal STV and the $(i+3)^{th}$ stage scan signal SC(i+3). When i is from 3 to 1021, the input signals (e.g. IN1-IN2 or IN3-IN4) of the $i^{th}$ stage shift register 210(i) are the $(i-2)^{th}$ stage scan signal SC(i-2) and the $(i+3)^{th}$ stage scan signal SC(i+3), respectively. When i is from 1022 to 1024, the input signals (e.g. IN1-IN2 or IN3-IN4) of the $i^{th}$ stage shift register 210(i) are the $(i-2)^{th}$ stage scan signal SC(i-2) and the ending signal RST, respectively.

In addition, in the case of N=1024 and j=4, when i is 1 or 2, the input signals (e.g. IN1-IN2 or IN3-IN4) of the $i^{th}$ stage shift register 210(i) are respectively the starting signal STV and the $(i+4)^{th}$ stage scan signal SC(i+4). When i is from 3 to 1020, the input signals (e.g. IN1-IN2 or IN3-IN4) of the $i^{th}$ stage shift register 210(i) are the $(i-2)^{th}$ stage scan signal SC(i-2) and the $(i+4)^{th}$ stage scan signal SC(i+4), respectively. When i is from 1021 to 1024, the input signals (e.g. IN1-IN2 or IN3-IN4) of the $i^{th}$ stage shift register 210(i) are the $(i-2)^{th}$ stage scan signal SC(i-2) and the ending signal RST, respectively.

It is noted that, in the aforementioned descriptions for FIGS. 3A-4B, j is an integer greater than 2, such that the operating duration of the pull-down units 330 and 430 can be extended, so as to improve the reliability of the shift registers 210(1)-210(N). In addition, in another embodiment, the gate driver 130 may only receive the dock signals C1-C4 and the starting signal STV. In such case, the transistor M2 of each of the $(N-j+1)^{th}$ to N stage shift registers 210(N-j+1)-210(N) is configured to receive the starting signal STV. In other words, in another embodiment, when i is from (N-j+1) to N, the input signals (e.g. IN1-IN2 or IN3-IN4) of the $i^{th}$ stage shift register 210(i) are the (i-2) stage scan signal SC(i-2) and the starting signal STV, respectively.

Figure 5:
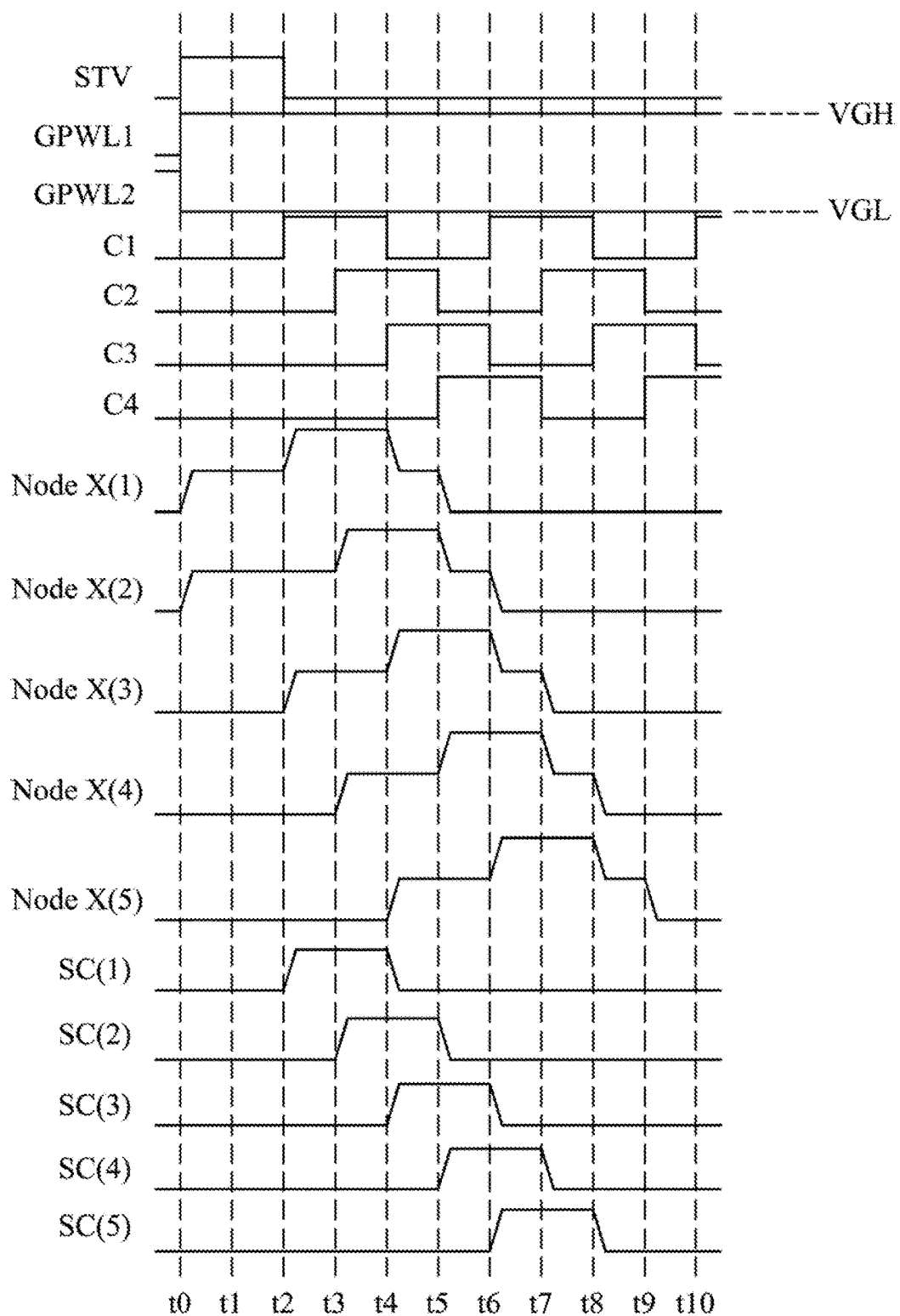
FIG. 5 is a time sequential diagram of the gate driver of FIG. 2A and FIG. 2B when j is equal to 3.
Figure 6:
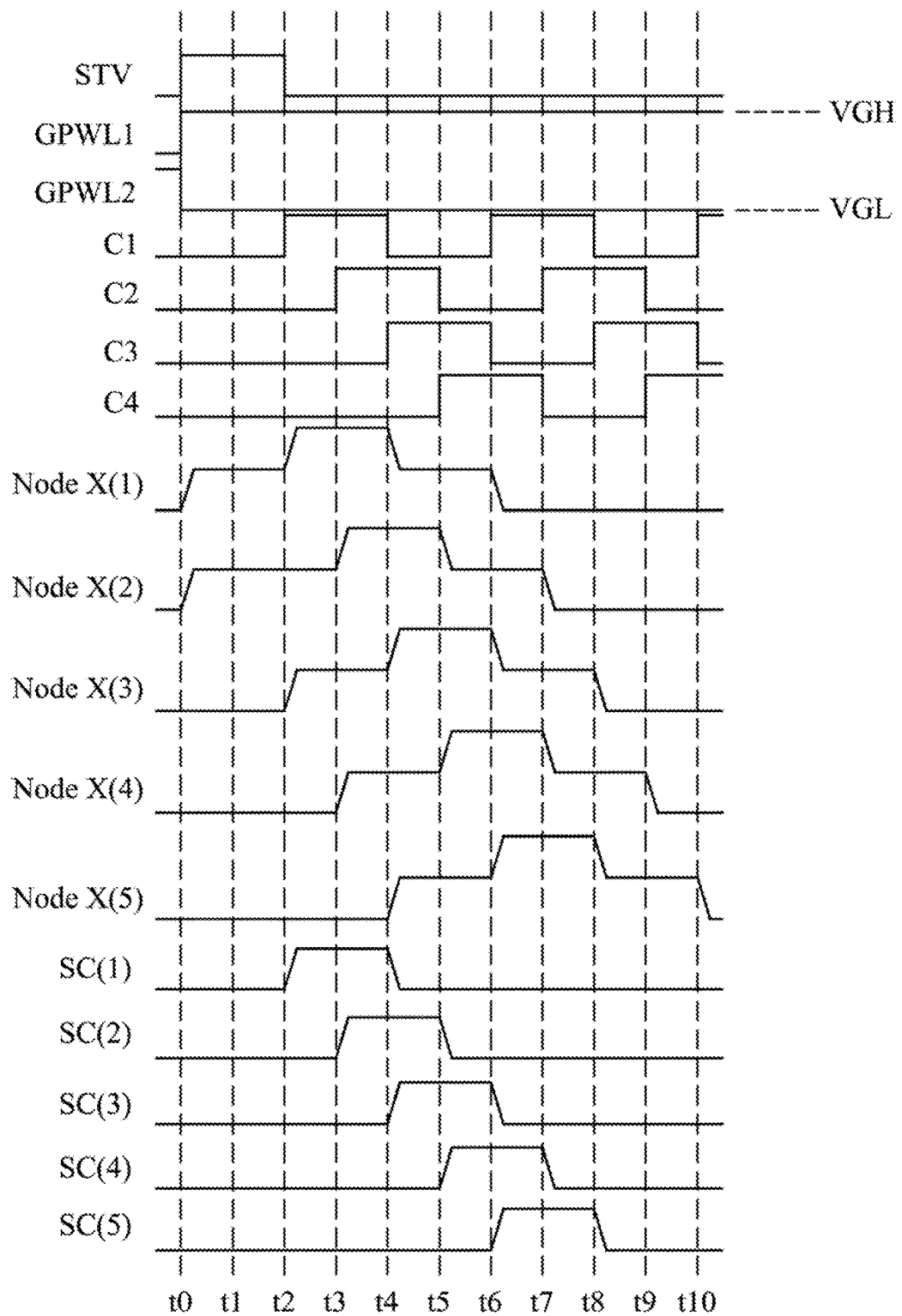
FIG. 6 is a time sequential diagram of the gate driver of FIG. 2A and FIG. 2B when j is equal to 4.

FIG. 5 and FIG. 6 are respective time sequential diagrams of the gate driver 130 of FIG. 2A and FIG. 2B when j is equal to 3 and when j is equal to 4. For facilitating description, FIG. 5 and FIG. 6 only show time sequential changes of a portion of signals of the $1^{st}$ to $5^{th}$ stage shift registers 210(1)-210(5). As shown in FIG. 5, when the starting signal STV rises from a low level to a high level at time t0, the levels of the node X(1) of the $1^{st}$ stage shift register 210(1) and the node X(2) of the $2^{nd}$ stage shift register 210(2) all rise from the low level to a first high level, while the levels of the node X(3) of the $3^{rd}$ stage shift register 210(3) to the node X(5) of the $3^{rd}$ stage shift register 210(5) keep at the low level due to the effect of the reset unit 440. At time t2 (i.e., after two time slots elapse; each adjacent two times differ by one time unit), the starting signal STV falls from a high level to the low level, while the clock signal C1 rises from the low level to the high level. At this time, the level of the node X(1) of the $1^{st}$ stage shift register 210(1) further rises from the first high level to a second high level, and the $1^{st}$ stage scan signal SC(1) rises from the low level to the high level. At time t4, the clock signal C1 falls from the high level to the low level, such that the $1^{st}$ stage scan signal SC(1) falls from the high level to the low level, and the level of the node X(1) of the $1^{st}$ stage shift register 210(1) falls from the second high level to the first high level. At time t5, the $4^{th}$ stage scan signal SC(4) rises from the low level to the high level by the effect of the clock signal C4, such that the level of the node X(1) of the $1^{st}$ stage shift register 210(1) falls from the first high level to the low level to reset the level of the node X(1).

Further, as shown in FIG. 6, when the starting signal STV rises from a low level to a high level at time t0, the levels of the node X(1) of the $1^{st}$ stage shift register 210(1) and the node X(2) of the $2^{nd}$ stage shift register 210(2) all rise from the low level to a first high level, while the levels of the node X(3) of the $3^{rd}$ stage shift register 210(3) to the node X(5) of the $3^{rd}$ stage shift register 210(5) keep at the low level by the effect of the reset unit 440. At time t2 (i.e., after two time slots elapse; each adjacent two times differ by one time unit), the starting signal STV falls from the high level to the low level, while the clock signal C1 rises from the low level to the high level. At this time, the level of the node X(1) of the $1^{st}$ stage shift register 210(1) further rises from the first high level to a second high level, and the $1^{st}$ stage scan signal SC(1) rises from the low level to the high level. At time t4, the clock signal C1 falls from the high level to the low level, such that the $1^{st}$ stage scan signal SC(1) falls from the high level to the low level, and the level of the node X(1) of the $1^{st}$ stage shift register 210(1) falls from the second high level to the first high level. At time t6, the $5^{th}$ stage scan signal SC(5) rises from the low level to the high level by the effect of the clock signal C1, such that the level of the node X(1) of the $1^{st}$ stage shift register 210(1) falls from the first high level to the low level to reset the level of the node X(1).

In FIG. 5 and FIG. 6, the clock signals C1-C4 sequentially rise from the low level to the high level at times t2, t3, t4 and t5. The period of the clock signals C1-C4 occupies four time units, and the high level duration and the low level duration of each of the clock signals C1-C4 occupy two time units, respectively. With the level changes of the clock signals C1-C4, the $1^{st}$ to $5^{th}$ stage scan signals SC(1)-SC(5) sequentially rise from the low level to the high level and then sequentially fall from the high level to the low level.

As shown in FIG. 5 and FIG. 6, because the $i^{th}$ stage shift register is reset by the $(i+j)^{th}$ stage shift register 210(i+j) (j is an integer greater than 2), the level of the node X(i) of the $i^{th}$ stage shift register 210(i) firstly falls from the second high level to the first high level and then falls from the first high level to the low level after (j−2) time units elapse, rather than directly falling from the second high level to the low level, which results in a slow transition of the $i^{th}$ stage scan signal SC(i) from the high level to the low level, For illustration, as shown in FIG. 5, the level of the node X(1) of the shift register 210(1) firstly falls from the second high level to the first high level at time t4 and then falls from the first high level to the low level at time t5 (i.e. after a time unit). As such, the completeness of the waveform of the $i^{th}$ stage scan signal SC(i) is ensured, such that erroneous data are prevented from being written into corresponding pixels to cause image display error, and the operating duration of the pull-down units 330 and 430 can also be extended.

It is noted that, the value of j may be adjusted in accordance with various specifications of the display apparatus 100, which is not limited to 3 (corresponding to FIG. 5) or 4 (corresponding to FIG. 6). That is, the relation between the scan signals and the shift registers for resetting can be correspondingly designed depending on, for example, the definition, the frames per second (FPS) or another specification of the display panel 110.

One feature of the invention is that, by utilizing next m stage (m>2) shift registers (e.g. next three or four stage shift registers) to reset the shift registers, the completeness of the waveforms of the scan signals generated by the gate driver can be ensured, erroneous data can be prevented from being written into corresponding pixels to cause image display error, and the levels of the nodes of the shift registers can be more stable without being interfered by noise (e.g. noise from another shift register), thereby improving image display quality of the display apparatus and preventing from display issues such as line mura defects, and therefore the display apparatus has high reliability and high stability. In addition, another feature of the invention is that, with the reset unit 440 of the $3^{rd}$ to $N^{th}$ stage shift registers 210(3)-210(N), the levels of the nodes X(3)-X(N) of the $3^{rd}$ to $N^{th}$ stage shift registers 210(3)-210(N) are reset as well as the floating states of the nodes X(3)-X(N) are eliminated before the $1^{st}$ to $N^{th}$ stage scan signals SC(1)-SC(N) are generated and when the starting signal STV rises to a high level, the noise effect to the nodes X(3)-X(N) can be suppressed without generating surges, and surges of the reference voltage VGL can be prevented from resulting in image display issues (such as small line mura defects, noise interference issue and blinking phenomenon), thereby improving the image display quality and the reliability of the shift registers and reducing the power consumption.

Figure 7:
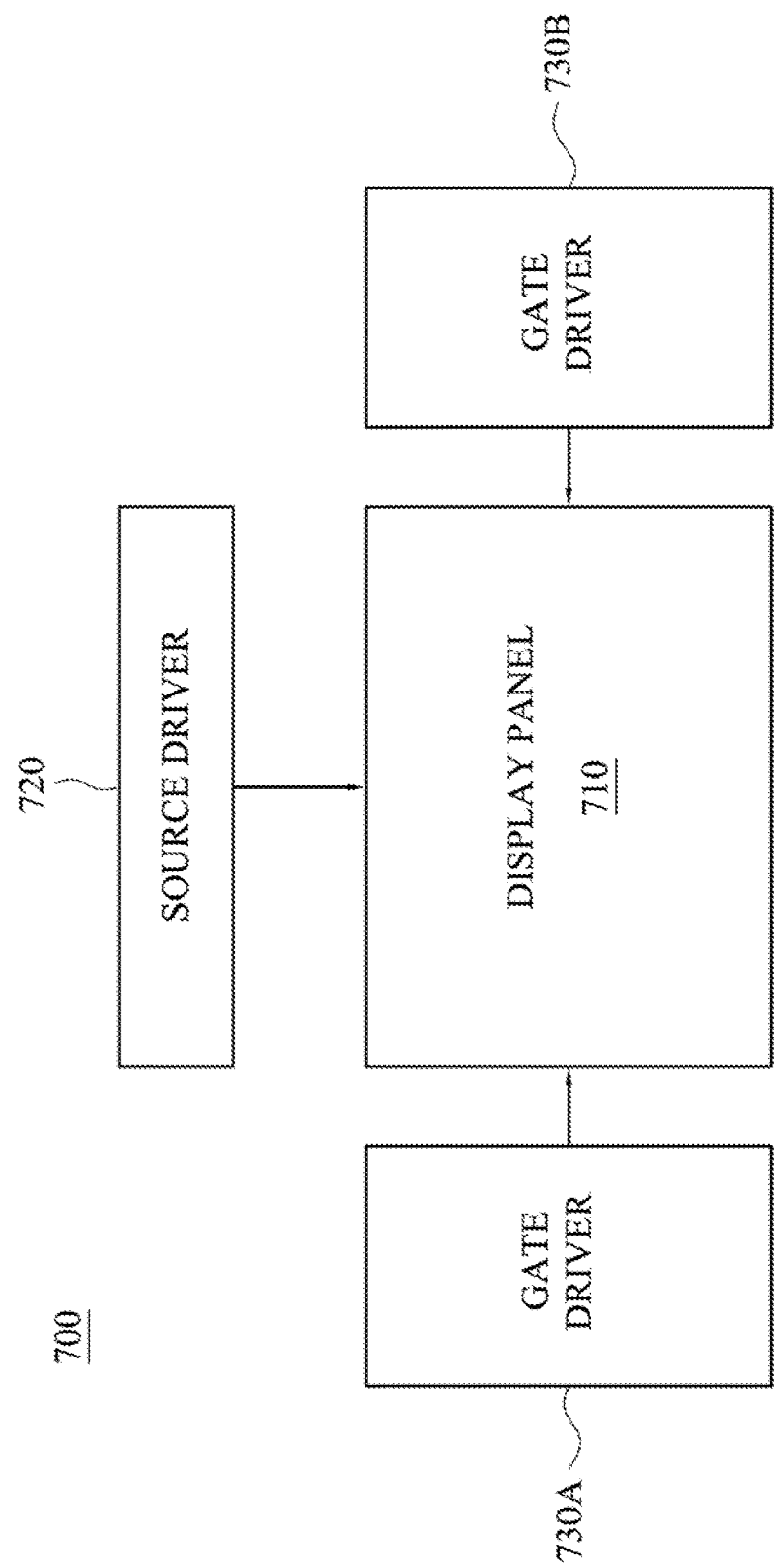
FIG. 7 is a schematic diagram of a display apparatus in accordance with some embodiments of the invention.

The technical features in the aforementioned embodiments may also be applied to a display apparatus with bi-directional driving. Referring to FIG. 7, which illustrates a schematic diagram of a display apparatus 700. The display apparatus 700 includes a display panel 710, a source driver 720 and gate drivers 730A and 730B. The display apparatus 700 is similar to the display apparatus of FIG. 1, and the difference between the display apparatuses 100 and 700 is that the display apparatus 700 includes two gate drivers (i.e. the gate drivers 730A and 730B). As shown in FIG. 7, the gate drivers 730A and 730B are disposed at two opposite sides of the display panel 710, respectively, and collectively transmit scan signals to the display panel 710. In another embodiment, the designs of the gate drivers 730A and 730B may be adjusted in accordance with various design requirements. The gate drivers 730A and 730B may include the same number of shift registers, and the time sequences of the scan signals outputted by the gate drivers 730A and 730B are the same. In some embodiments, the gate drivers 730A and 730B may be the gate driver 130 of FIG. 1, and the time sequences of the scan signals outputted by the gate drivers 730A are respectively the same as those of the scan signals outputted by the gate drivers 730B. The display panel 710 and the source driver 720 are similar to the display panel 110 and the source driver 120 of FIG. 1, respectively, and the description is not described again herein.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:

1. A gate driving circuit for driving a display panel, the gate driving circuit comprising:

$1^{st}$ to $N^{th}$ stage shift registers for respectively generating and sequentially outputting $1^{st}$ to $N^{th}$ stage scan signals to the display panel, wherein each of the shift registers is configured to receive a starting signal, and the starting signal is utilized to trigger the $1^{st}$ and $2^{nd}$ stage shift registers to generate the $1^{st}$ and $2^{nd}$ stage scan signals respectively, and the starting signal is utilized to reset the $3^{rd}$ to $N^{th}$ stage shift registers, wherein N is an integer greater than or equal to 4;

wherein an $i^{th}$ stage shift register comprises:

a precharge unit configured to receive a first input signal and a second input signal and to output a precharge signal via a node based on the first input signal and the second input signal;

a pull-up unit coupled to the precharge unit, wherein the pull-up unit is configured to receive the precharge signal and a clock signal and to output an $i^{th}$ stage scan signal based on the precharge signal and the clock signal;

a pull-down unit coupled to the precharge unit and the pull-up unit, wherein the pull-down unit is configured to receive the precharge signal and a pull-down control signal and to control a level of the $i^{th}$ stage scan signal based on the precharge signal and the pull-down control signal; and a reset unit coupled to the precharge unit and the pull-up unit, wherein the reset unit comprises:

a reset transistor, wherein a gate of the reset transistor is configured to receive the starting signal, one of a source and a drain of the reset transistor is configured to receive a reference voltage, and the other of the source and the drain of the reset transistor is coupled to the node;

wherein i is an integer from 3 to N.

2. The gate driving circuit of claim 1, wherein the $i^{th}$ stage scan signal is further configured to reset an $(i-j)^{th}$ stage shift register, wherein i is from 4 to N, and j is an integer greater than 2 and smaller than i.

3. The gate driving circuit of claim 2, wherein j is 3 or 4.

4. The gate driving circuit of claim 1, wherein the precharge unit comprises:

a first transistor, wherein a gate of the first transistor is configured to receive the first input signal, one of a source and a drain of the first transistor is configured to receive a first reference voltage, and the other of the source and the drain of the first transistor is coupled to the node; and a second transistor, wherein a gate of the second transistor is configured to receive the second input signal, one of a source and a drain of the second transistor is configured to receive a second reference voltage, and the other of the source and the drain of the second transistor is coupled to the node.

5. The gate driving circuit of claim 4, wherein:

when i is from 3 to (N−j), the first input signal is the $(i-2)^{th}$ stage scan signal, and the second input signal is an $(i+j)^{th}$ stage scan signal; and when i is from (N−j+1) to N, the first input signal is the $(i-2)^{th}$ stage scan signal, and the second input signal is the starting signal or an ending signal;

wherein j is an integer greater than 2 and smaller than (N−2).

6. The gate driving circuit of claim 1, wherein the pull-up unit comprises:

a third transistor, wherein a gate of the third transistor is coupled to the node, one of a source and a drain of the third transistor is configured to output the $i^{th}$ stage scan signal, and the other of the source and the drain of the third transistor is configured to receive the clock signal.

7. The gate driving circuit of claim 1, wherein the pull-down unit comprises:

a fourth transistor, wherein one of a source and a drain of the fourth transistor is configured to receive a reference voltage, and the other of the source and the drain of the fourth transistor is configured to receive a third input signal;

a fifth transistor, wherein a gate of the fifth transistor is coupled to a gate of the fourth transistor, one of a source and a drain of the fifth transistor is configured to receive the reference voltage, and the other of the source and the drain of the fifth transistor is configured to receive a fourth input signal;

a sixth transistor, wherein a gate of the sixth transistor is coupled to the gate of the fourth transistor, one of a source and a drain of the sixth transistor is configured to receive the reference voltage, and the other of the source and the drain of the sixth transistor is configured to receive a fifth input signal;

a seventh transistor, wherein a gate of the seventh transistor is coupled to the gate of the fourth transistor, one of a source and a drain of the seventh transistor is configured to receive the reference voltage, and the other of the source and the drain of the seventh transistor is configured to receive a sixth input signal;

an eighth transistor, wherein one of a source and a drain of the eighth transistor is configured to receive the pull-down control signal, and the other of the source and the drain of the eighth transistor is coupled to the gate of the fourth transistor;

a ninth transistor, wherein a gate and one of a source and a drain of the ninth transistor are configured to receive the pull-down control signal, and the other of the source and the drain of the ninth transistor is coupled to a gate of the eighth transistor;

a tenth transistor, wherein a gate of the tenth transistor is configured to receive a seventh input signal, one of a source and a drain of the tenth transistor is configured to receive the reference voltage, and the other of the source and the drain of the tenth transistor is coupled to the gate of the fourth transistor;

an eleventh transistor, wherein a gate of the eleventh transistor is configured to receive the third input signal, one of a source and a drain of the fourth transistor is configured to receive the reference voltage, and the other of the source and the drain of the eleventh transistor is coupled to the gate of the fourth transistor;

a twelfth transistor, wherein a gate of the twelfth transistor is configured to receive the fifth input signal, one of a source and a drain of the twelfth transistor is configured to receive the reference voltage, and the other of the source and the drain of the fourth transistor is coupled to the gate of the eighth transistor; and a thirteenth transistor, wherein a gate of the thirteenth transistor is configured to receive the third input signal, one of a source and a drain of the thirteenth transistor is configured to receive the reference voltage, and the other of the source and the drain of the thirteenth transistor is coupled to the gate of the eighth transistor.

8. The gate driving circuit of claim 7, wherein when i is an odd number, the third input signal is the precharge signal at the node of the $i^{th}$ stage shift register, the fourth input signal is the $i^{th}$ stage scan signal, the fifth input signal is the precharge signal at the node of the $(i+1)^{th}$ stage shift register, the sixth input signal the $(i+1)^{th}$ stage scan signal, and the seventh input signal is the $(i-2)^{th}$ stage scan signal.

9. The gate driving circuit of claim 7, wherein when i is an even number, the third input signal is the precharge signal at the node of the $(i-1)^{th}$ stage shift register, the fourth input signal is the $(i-1)^{th}$ stage scan signal, the fifth input signal is the precharge signal at the node of the $i^{th}$ stage shift register, the sixth input signal the $i^{th}$ stage scan signal, and the seventh input signal is the $(i-3)^{th}$ stage scan signal.

10. The gate driving circuit of claim 1, wherein the reset unit is configured to reset a level at the node of the $i^{th}$ stage shift register before the scan signals are generated.

11. The gate driving circuit of claim 1, wherein a $k^{th}$ stage scan signal is inputted to the pull-down unit of a $(k+1)^{th}$ stage shift register, and a $(k+1)^{th}$ stage scan signal is inputted to the pull-down unit of a $k^{th}$ stage shift register, where k is an odd number greater than or equal to 1 and smaller than or equal to N.

12. The gate driving circuit of claim 1, wherein the clock signals respectively of adjacent two stage shift registers of the shift registers differ by ¼ clock period of the clock signals in phase.

13. The gate driving circuit of claim 1, wherein the pull-down control signals respectively of adjacent two stage shift registers of the shift registers are substantially phase-inverted from each other.

14. A display apparatus, comprising:
a display panel; and
a gate driving circuit for driving the display panel, wherein the gate driving circuit comprises $1^{st}$ to $N^{th}$ stage shift registers for respectively generating and sequentially outputting $1^{st}$ to $N^{th}$ stage scan signals to the display panel, and each of the shift registers is configured to receive a starting signal, and the starting signal is utilized to trigger the $1^{st}$ and $2^{nd}$ stage shift registers to generate the $1^{st}$ and $2^{nd}$ stage scan signals respectively, and is utilized to reset the $3^{rd}$ to $N^{th}$ stage shift registers, wherein N is an integer greater than or equal to 4;
wherein an $i^{th}$ stage shift register comprises:
  a precharge unit configured to receive a first input signal and a second input signal and to output a precharge signal via a node based on the first input signal and the second input signal;
  a pull-up unit coupled to the precharge unit, wherein the pull-up unit is configured to receive the precharge signal and a clock signal and to output an $i^{th}$ stage scan signal based on the precharge signal and the clock signal;
  a pull-down unit coupled to the precharge unit and the pull-up unit, wherein the pull-down unit is configured to receive the precharge signal and a pull-down control signal and to control a level of the $i^{th}$ stage scan signal based on the precharge signal and the pull-down control signal; and
  a reset unit coupled to the precharge unit and the pull-up unit, wherein the reset unit comprises:
    a reset transistor, wherein a gate of the reset transistor is configured to receive the starting signal, one of a source and a drain of the reset transistor is configured to receive a reference voltage, and the other of the source and the drain of the reset transistor is coupled to the node;
wherein i is an integer from 3 to N.

15. The display apparatus of claim 14, wherein the $i^{th}$ stage scan signal is further configured to reset an $(i-j)^{th}$ stage shift register, wherein i is from 4 to N, and j is an integer greater than 2 and smaller than i.

16. The gate driving circuit of claim 1, wherein an $m^{th}$ shift register comprises:
a precharge unit configured to receive the starting signal and an $(m+j)^{th}$ stage scan signal and to output a precharge signal via a node based on the starting signal and the $(m+j)^{th}$ stage scan signal;
a pull-up unit coupled to the precharge unit, wherein the pull-up unit is configured to receive the precharge signal and a clock signal and to output an $m^{th}$ stage scan signal based on the precharge signal and the clock signal; and
a pull-down unit coupled to the precharge unit and the pull-up unit, wherein the pull-down unit is configured to receive the precharge signal and a pull-down control signal and to control a level of the $m^{th}$ stage scan signal based on the precharge signal and the pull-down control signal;
wherein m is 1 or 2, and j is an integer greater than 2 or less or equal to (N−m).

17. The gate driving circuit of claim 16, wherein j is 3 or 4.

18. A display apparatus, comprising:
a display panel;
a first gate driving circuit disposed at one side of the display panel for driving the display panel, wherein the first gate driving circuit comprises $1^{st}$ to $N^{th}$ stage first shift registers for respectively generating and sequentially outputting $1^{st}$ to $N^{th}$ stage first scan signals to the display panel, and each of the first shift registers is configured to receive a first starting signal, and the first starting signal is utilized to trigger the $1^{st}$ and $2^{nd}$ stage first shift registers to generate the $1^{st}$ and $2^{nd}$ stage first scan signals respectively, and is utilized to reset the $3^{rd}$ to $N^{th}$ stage first shift registers, wherein N is an integer greater than or equal to 4; and
a second gate driving circuit disposed at an opposite side of the display panel for driving the display panel, wherein the second gate driving circuit comprises $1^{st}$ to $N^{th}$ stage second shift registers for respectively generating and sequentially outputting $1^{st}$ to $N^{th}$ stage second scan signals to the display panel, and each of the second shift registers is configured to receive a second starting signal, and the second starting signal is utilized to trigger the $1^{st}$ and $2^{nd}$ stage second shift registers to generate the $1^{st}$ and $2^{nd}$ stage second scan signals, respectively, and is utilized to reset the $3^{rd}$ to $N^{th}$ stage second shift registers;
wherein an $i^{th}$ first stage shift register comprises:
  a first precharge unit configured to receive a first input signal and a second input signal and to output a first precharge signal via a first node based on the first input signal and the second input signal;
  a first pull-up unit coupled to the first precharge unit, wherein the first pull-up unit is configured to receive the first precharge signal and a first clock signal and to output an $i^{th}$ stage first scan signal based on the first precharge signal and the first clock signal;
  a first pull-down unit coupled to the first precharge unit and the first pull-up unit, wherein the first pull-down unit is configured to receive the first precharge signal and a first pull-down control signal and to control a level of the $i^{th}$ first stage scan signal based on the first precharge signal and the first pull-down control signal; and a first reset unit coupled to the first precharge unit and the first pull-up unit, wherein the first reset unit comprises:

a first reset transistor, wherein a gate of the first reset transistor is configured to receive the starting signal, one of a source and a drain of the first reset transistor is configured to receive a first reference voltage, and the other of the source and the drain of the first reset transistor is coupled to the first node;

wherein an $i^{th}$ second stage shift register comprises:

a second precharge unit configured to receive a third input signal and a fourth input signal and to output a second precharge signal via a second node based on the third input signal and the fourth input signal;

a second pull-up unit coupled to the second precharge unit, wherein the second pull-up unit is configured to receive the second precharge signal and a second clock signal and to output an $i^{th}$ stage second scan signal based on the second precharge signal and the second clock signal;

a second pull-down unit coupled to the second precharge unit and the second pull-up unit, wherein the second pull-down unit is configured to receive the second precharge signal and a second pull-down control signal and to control a level of the $i^{th}$ second stage scan signal based on the second precharge signal and the second pull-down control signal; and a second reset unit coupled to the second precharge unit and the second pull-up unit, wherein the second reset unit comprises:

a second reset transistor, wherein a gate of the second reset transistor is configured to receive the starting signal, one of a source and a drain of the second reset transistor is configured to receive a second reference voltage, and the other of the source and the drain of the second reset transistor is coupled to the second node;

wherein i is an integer from 3 to N.

19. The display apparatus of claim 18, wherein the $i^{th}$ stage first scan signal is further configured to reset an $(i-j)^{th}$ stage first shift register, and the $i^{th}$ stage second scan signal is further configured to reset an $(i-j)^{th}$ stage second shift register, wherein i is from 4 to N, and j is an integer greater than 2 and smaller than i.

20. The display apparatus of claim 18, wherein time sequences of the first scan signals are the same as time sequences of the second scan signals, respectively.

* * * * *